US006647035B1

(12) United States Patent
Freitas et al.

(10) Patent No.: US 6,647,035 B1
(45) Date of Patent: Nov. 11, 2003

(54) RUGGEDIZED MICROCHANNEL-COOLED LASER DIODE ARRAY WITH SELF-ALIGNED MICROLENS

(75) Inventors: Barry L. Freitas, Livermore, CA (US); Jay A. Skidmore, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 213 days.

(21) Appl. No.: 09/690,932

(22) Filed: Oct. 17, 2000

(51) Int. Cl.⁷ .................................................. H01S 3/04
(52) U.S. Cl. ........................................... 372/36; 372/35
(58) Field of Search ..................................... 372/34–36

(56) References Cited

U.S. PATENT DOCUMENTS

| | | | |
|---|---|---|---|
| 5,040,187 A | 8/1991 | Karpinski | 372/50 |
| 5,105,429 A | 4/1992 | Mundinger et al. | 372/34 |
| 5,105,430 A | 4/1992 | Mundinger et al. | 372/35 |
| 5,548,605 A * | 8/1996 | Benett et al. | 372/36 |
| 5,727,618 A | 3/1998 | Mundinger et al. | 165/80.4 |
| 5,828,683 A | 10/1998 | Freitas | 372/36 |
| 5,835,518 A | 11/1998 | Mundinger et al. | 372/50 |
| 5,903,583 A * | 5/1999 | Ullman et al. | 372/35 |
| 5,909,458 A | 6/1999 | Freitas et al. | 372/36 |
| 5,923,481 A | 7/1999 | Skidmore et al. | 359/819 |
| 5,930,279 A * | 7/1999 | Apollonov et al. | 372/50 |

* cited by examiner

*Primary Examiner*—Paul Ip
*Assistant Examiner*—Davienne Monbleau
(74) *Attorney, Agent, or Firm*—John P. Woodridge; Alan H. Thompson

(57) ABSTRACT

A microchannel-cooled, optically corrected, laser diode array is fabricated by mounting laser diode bars onto Si surfaces. This approach allows for the highest thermal impedance, in a ruggedized, low-cost assembly that includes passive microlens attachment without the need for lens frames. The microlensed laser diode array is usable in all solid-state laser systems that require efficient, directional, narrow bandwidth, high optical power density pump sources.

18 Claims, 5 Drawing Sheets

US 6,647,035 B1

RUGGEDIZED MICROCHANNEL-COOLED LASER DIODE ARRAY WITH SELF-ALIGNED MICROLENS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to laser diode arrays, and more specifically, it relates to the use of micro-machined Si wafers and glass inserts to produce laser diode arrays in a ruggedized, high-average-power, low-cost, self-aligned microlensed assembly.

2. Description of Related Art

Laser diode arrays are used in a wide range of commercial, medical and military applications. These applications include materials processing (soldering, cutting, metal hardening), display technology/graphics, medical imaging (MRI) and surgical procedures (corneal shaping, tissue fusion, dermatology, photodynamic therapy), satellite communication, remote sensing, and inertial fusion confinement/energy. In most solid-state laser applications it is desirable to use laser diode arrays to optically excite, i.e., "pump" the crystal hosts. Diodes offer a narrow band of emission, compactness, high electrical efficiency and higher reliability as compared to flash lamps. Despite these numerous advantages, however, diode-pumped solid-state lasers (DPSSLs) have gained slow market acceptance due to the high cost associated with the laser-diode-array pumps. In addition, higher diode array performance (power/thermal) and better system reliability would enable new architectures and wider deployment of DPSSLs than were previously unattainable.

As laser diodes become capable of attaining higher peak output power, it becomes increasingly important to reject the thermal waste heat to not limit the maximum average-power possible. State-of-the-art near-IR laser diodes may produce up to 150 W of peak power/cm, but due to thermal limitations, are typical restricted to ~50 W (for reliable cw operation). The reliable output power level is determined by the temperature of the laser diode junction, which in turn is governed by the thermal impedance of the heatsink. When the diode junction temperature rises, deleterious effects occur, including the loss of output power (and efficiency), wavelength drift and reduced lifetime. Thus, a low-thermal-impedance heatsink will reduce the cost of a diode array in terms of dollars per Watt (average).

Presently, the microchannel cooling technology provides the most aggressive heatsink (i.e., lowest thermal impedance), wherein each laser bar is water-cooled separately from its neighbors. However, this architecture requires the use of elastomer gaskets to form the water seal between neighboring heatsink packages. For large diode array systems, especially those that are subject to vibration or those that cannot be easily maintained (i.e., airborne), the large number of gaskets poses a liability. Most commercial laser diode array architectures eliminate water seals by utilizing a single self-contained water-cooled heatsink that is bonded to an array of diode bars separated by heat spreaders. Unfortunately, the thermal impedance is significantly higher (~5x) compared to microchannel heatsinks because the coolant in these architectures cannot be located proximate to the diode bar. This becomes more problematic as diode bars become longer (cavity length >2 mm), as this necessitates moving the heat source still farther away from the coolant (this could be mitigated by increasing the diode spacing with the penalty of lowering the irradiance). The result is that commercial diode arrays based on non-microchannel-cooled-heatsink technology do not scale well to state-of-the-art diodes under high-average power conditions.

The present invention maintains the maximum possible thermal performance of the microchannel design, while benefiting from an inherently ruggedized architecture that exploits the robustness and simplicity of the more conventional approaches. Moreover, the use of Si micro-machined heatsinks allows a convenient method for fabricating the lens frame within the heatsink itself, which will enable passive lens alignment and further simplify and reduce cost.

SUMMARY OF THE INVENTION

It is an object of the present invention to provide a ruggedized, optically corrected, self-aligned, microchannel cooled, laser diode array.

The invention is a 2-dimensional laser diode array having a geometry that combines advanced packaging entities, (e.g., corrective micro-lens, high optical power density and high thermal performance heatsink). Nominal laser diode densities to ~10 bars/cm, that is independent of cavity length (and application), are achieved, which is comparable to or better than other architectures. This design provides the passive alignment of microlenses, which is necessary for simplicity and low cost.

The present laser diode array is rugged and is actively cooled for very-low thermal impedance. The laser diode array of the present invention need not be microlensed for certain applications, may be operated in any pulse-format, and is especially attractive for high-average power or continuous-wave operation, depending on the application. Each laser bar is individually heat sunk by a microchannel layer, even though the manufacturing method of mounting bars is robust and processed at a "monolithic" level. The laser diodes are placed in an array of slots that are accurately placed on the cooler surface and the laser diode emitting surface is placed in close proximity to the edge of the heatsink. The heatsink surface also provides a v-shaped frame that will allow passive or active alignment of microlenses.

DETAILED DESCRIPTION OF THE INVENTION

Figure 1A:
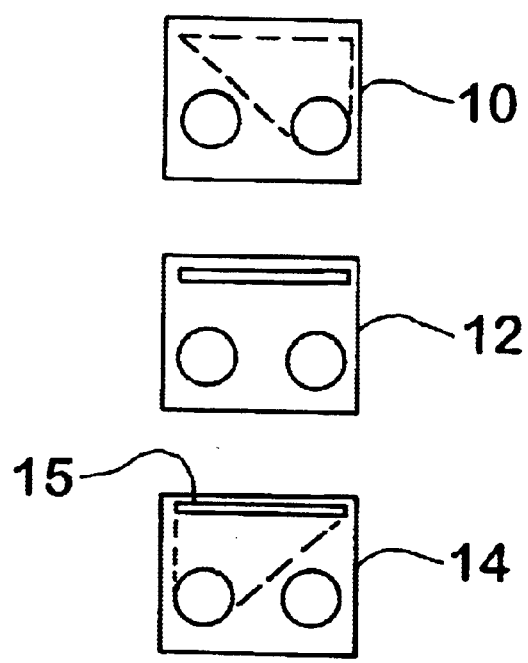
FIG. 1A shows the three fundamental layers necessary to fabricate a microchannel heatsink: Si manifold, glass insert, and Si microchannel layers that are composed of etched/micromachined Si and glass wafers.
Figure 1B:
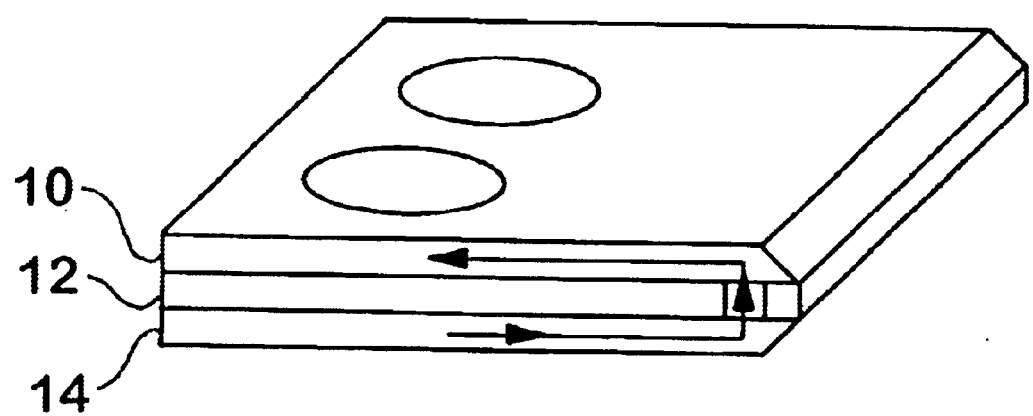
FIGS. 1B shows a cross-sectional view of a single microchannel heatsink after dicing.

The submount or heatsink used for mounting laser bars is fabricated from wettched Si wafers that have been described in the literature. For example, see U.S. Pat. No. 5,828,683 titled "High Density, Optically Corrected, Microhannel Cooled, VGroove Monolithic Laser Diode Array," U.S. Pat. No. 5,909,458 titled "LowCost Laser Diode Array" and U.S. Pat. No. 5,923,481 titled "Microlens Frames For Laser Diode Arrays" all incorporated herein by reference. Briefly "micromachining" of Si is accomplished by exploiting the highly anisotropic etching behavior of different crystal planes (>600:1) to make unique geometries. The process begins by depositing an etch mask on both surfaces of a (110) Si wafer, removing the etch mask in certain regions lithographically, and subsequently wet-etching (e.g., KOH or EDP) the wafer. The microchannels are formed by masking the wafer with stripes (~10–20 μm wide on a ~30–40 μm spacing), and wet etching. Note that the microchannels are orientated by 35.3 degrees (as shown in FIG. 1A as reference number 15) to produce vertical slots, as the {111} etch planes are exposed (and the length of the microchannels is ~equal to the diode cavity length, where the waste heat is generated). At the same time, a canted edge can be etched into the structure. FIG. 1A shows a simplistic view of the primary components after they have been diced from a wafer: manifold layer 10, glass insert layer 12 to direct water flow and microchannel layer 14 (with microchannel array 15) that provides aggressive cooling. The three layers are anodically bonded together as described elsewhere (with the Si layer attached to the positive electrode and the glass insert attached to the negative electrode). Afterwards, the 3-layer wafer is diced into smaller units. Also shown in the figure is coolant inlet 1, coolant outlet 2, glass insert inlet through-hole 3, glass insert outlet through-hole 4, microchannel layer inlet 5, microchannel layer outlet 6, coolant outlet duct 7, microchannel layer duct 8 and glass insert edge opening 9. FIG. 1B shows a cross-sectional view of the microchannels and canted edge of a minimum unit that could mount (heatsink) a single diode bar.

Figure 2:
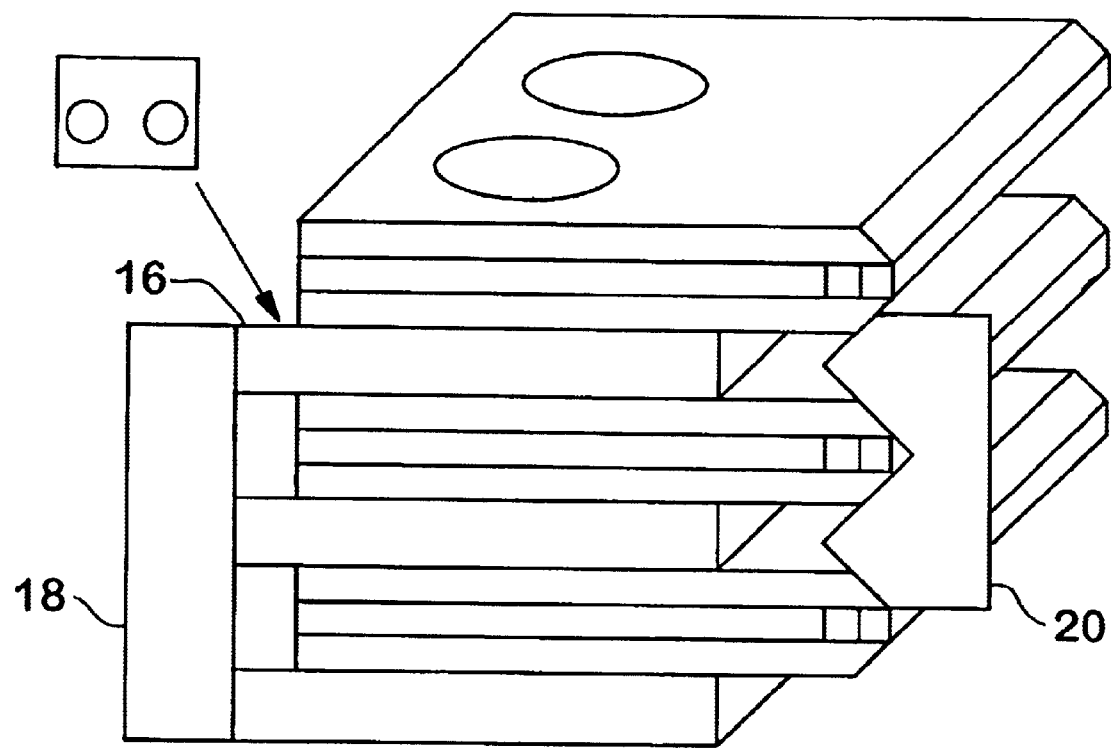
FIG. 2 shows the glass layer that makes the water seal between microchannel heatsinks during the anodic bonding process.

The glass seals 16 are sandwiched between the 3-layer heatsinks and are anodically bonded together as shown in FIG. 2. The glass seals are located so that the output facet of the diode bar is nominally flush with the top surface of the heatsink. To facilitate anodic bonding, the glass seals may be offset as shown. Note the placement of the cathode 18 and the anode 20 for anodic bonding. The glass seal must be slightly thicker than the subsequently loaded diode bar (~150 μm). After anodic bonding, the heatsink assembly can be handled and processed as a single unit and leak tested prior to completing any additional process steps. In principle, all four layers (or more), could be anodically bonded together simultaneously depending on the complexity of the bonding fixture.

Figure 3:
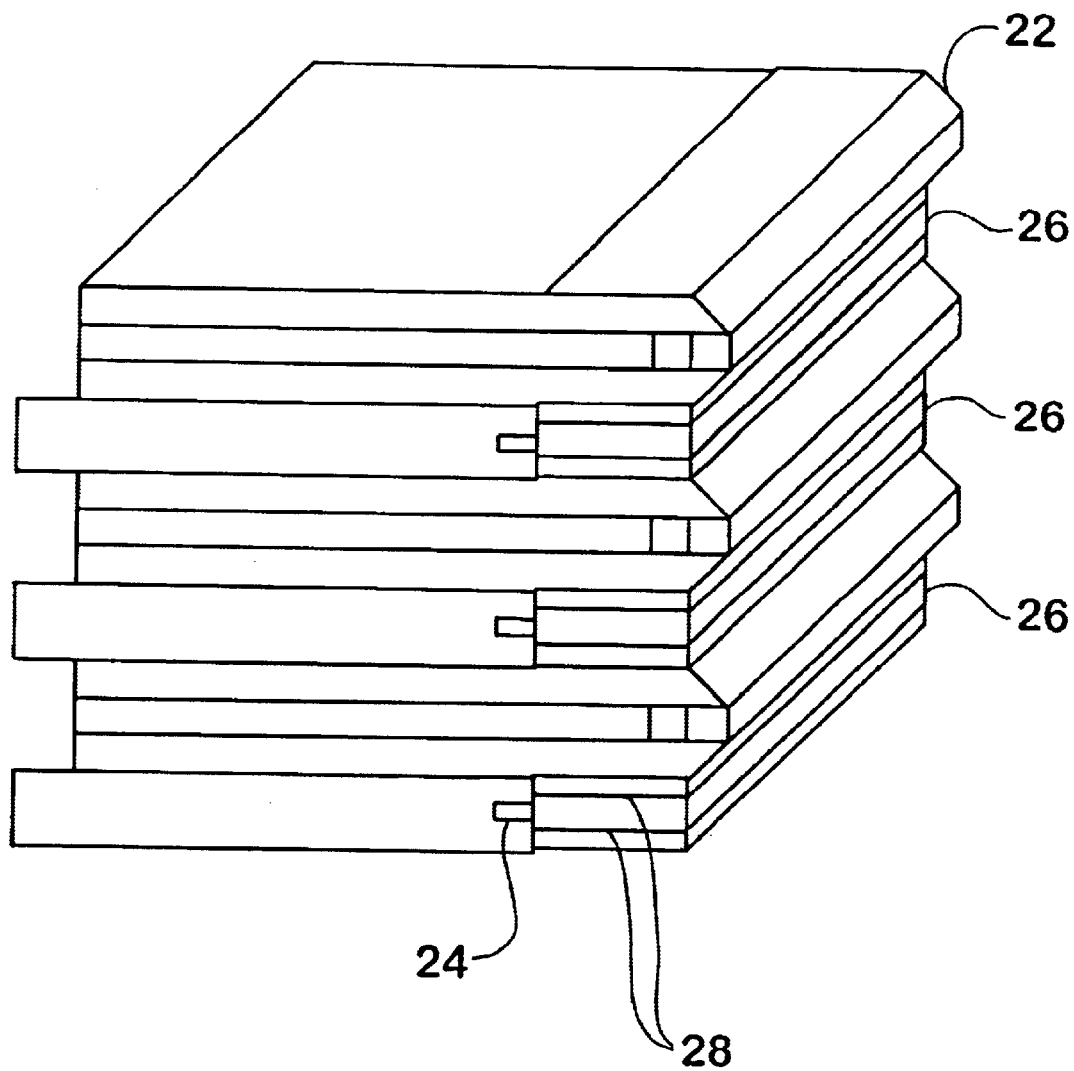
FIG. 3 shows a typical configuration of a completed laser diode array, wherein diode bars are centered in the grooves.

As shown in FIG. 3, the front side 22 of the heatsink assembly is metalized (using a thin adhesion layer (e.g., Ti) followed by a thicker layer of highly conductive material, (e.g., Ag). Afterwards a notch 24 is formed in the glass seal (e.g., with a dicing saw) so as to electrically "break" the metal at the base of the slot. Alternatively, the notch could be formed prior to metalization and the break could be formed by two successive, opposing-angled metalizations. The notch depth is not critical, but must ensure adequate electrical isolation. The notch width should be smaller than the bar thickness, so that the diode bar will reference off of the base of the slot.

A laser diode bar 26 is loaded into each of the slots (typically with the p-side facing the microchannel side for lowest thermal resistance). The heatsink assembly is then heated (either by using the microchannels themselves, or some other means) so that the assembly is elevated above the solder melting point. A solder 28 (such as In) is flowed into the vacant region surrounding the front and backside of the diode bar and the array is cooled to fix the solder. In this configuration, the diode bar is nominally centered in the slot.

Figure 4:
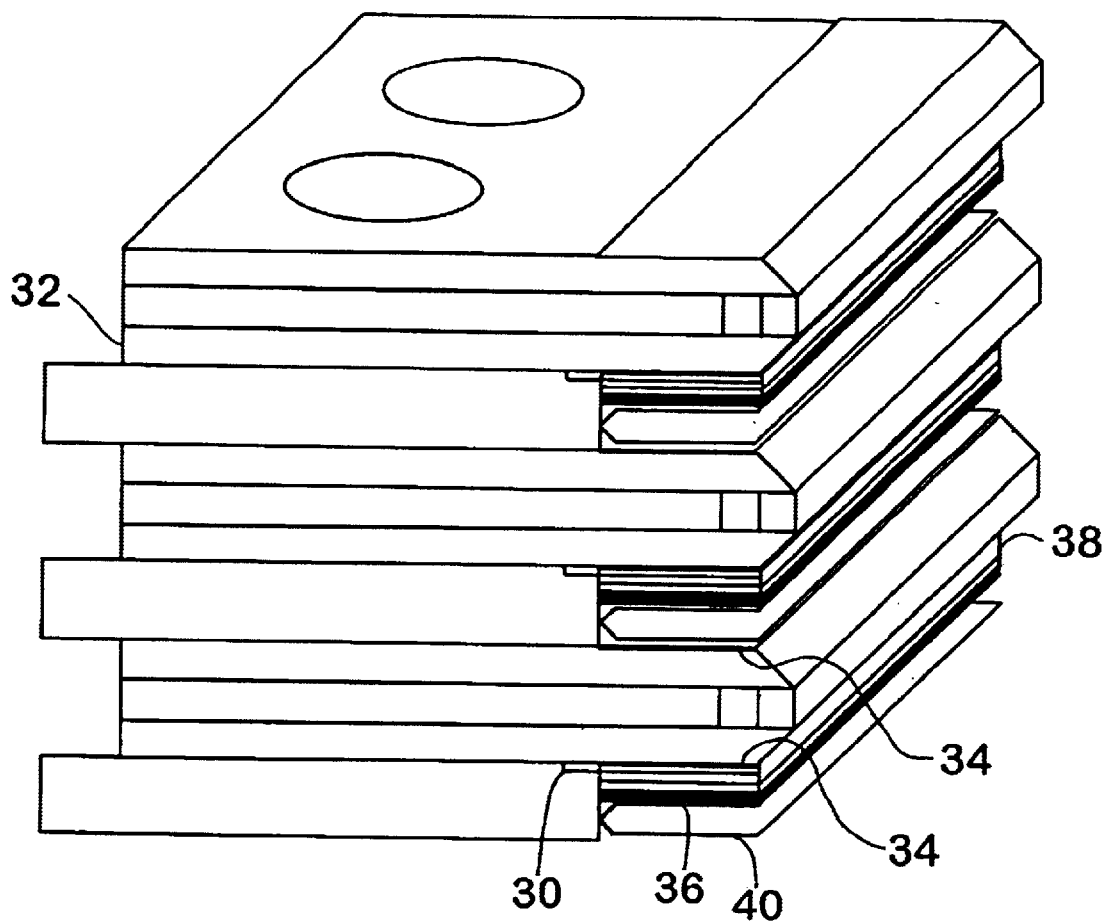
FIG. 4 shows a configuration wherein the diode bars are registered directly against the microchannel wall.

Alternatively, the diode bar active layer can be registered against the microchannel wall, regardless of the width of the groove (shown in FIG. 4). In this case, the electrical break (notch) 30 would be formed adjacent to the microchannel 32 wall. This could be accomplished by pre-fabricating a notch in the glass seal, prior to anodic bonding. After anodic bonding, the heatsink would be metalized as described previously. Rather than flow In solder (as described previously), the In 34 could be deposited (e.g., evaporated) to several micrometers thick on the microchannel wall. Then the diode bars are inserted into the slots against the wall with the corresponding notch. In order to form the electrical contact between neighboring diode bars, an electrically conductive spring 36, e.g., Be/Cu or Cu/W foil, (shown v-shaped) would be inserted between the backside of the diode bar 38 and the opposing Si wall (the contact could be soldered permanently if desired, but is not required). The v-spring would provide restoring force to the diode bar during the solder reflow process and to ensure a good electrical contact. If long-cavity diode bars were used, then it would be desirable to include a current spreader 40 between the diode bar and the spring to ensure uniform electrical pumping across the diode bar, and to provide mechanical protection from the spring. The current spreader 40 is an electrically conductive foil/bar that has the same nominal footprint as the diode bar. The current spreader may be secured with thin-film solder if desired.

Figure 5:
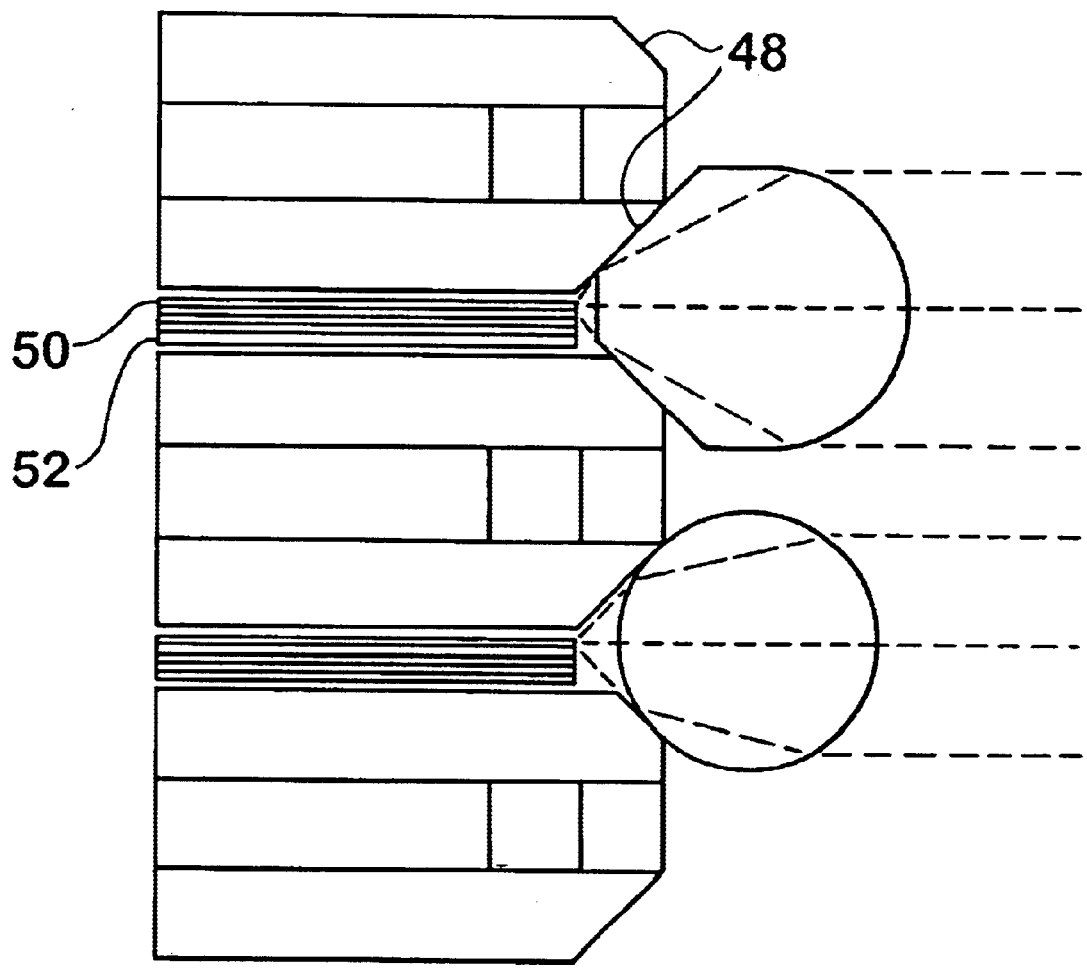
FIGS. 5 shows a cross-sectional view of a laser diode array that is microlensed and where the asymmetric canted edges on the Si layers provide a support frame that allows passive lens alignment.

The canted edge above the diode bar can be formed via wet etching. If the diode array is to be microlensed, then the position/size of the canted edge 48 can be judiciously controlled such that the active area 50 of the laser diode 52 (which is adjacent to the p-side of the diode bar) lies midway between the canted edges of the surrounding Si microchannel and manifold layers (FIG. 5). This structure allows a convenient method for registering and attaching microlenses to collimate the output emission, if that is desired. The microlenses can then be attached to the structure (the same Si canted edges could be used to attach the lens if active alignment were desired).

Changes and modifications in the specifically described embodiments can be carried out without departing from the scope of the invention, which is intended to be limited by the scope of the appended claims.

We claim:

1. A laser diode package, comprising:
   a first heatsink package, having:
   a manifold layer with a coolant inlet, a coolant outlet and a coolant outlet duct running from near an edge of said manifold layer to said coolant outlet;
   a glass insert layer fixedly connected to said manifold layer, wherein said glass insert layer includes a glass insert inlet through-hole aligned with said coolant inlet, a glass insert edge opening aligned in proximity to said edge of said manifold layer and a glass insert outlet through-hole aligned with said coolant outlet;
   a microchannel layer fixedly connected to said glass insert layer, wherein said microchannel layer includes a microchannel coolant inlet aligned with said glass insert inlet through-hole, wherein said microchannel layer further comprises a microchannel layer outlet aligned with said glass insert outlet through-hole, wherein said microchannel layer includes a microchannel layer duct running from said microchannel coolant inlet to near an edge of said microchannel layer in proximity o said glass insert edge opening, wherein said microchannel layer duct comprises a microchannel array; and a conductive coating adherent to an outer portion of said first heatsink package in proximity to said edge of said microchannel layer, an edge of said glass insert layer in proximity to said glass insert edge opening and said edge of said manifold layer, wherein said edge of said glass insert layer defines the operating side of said first heatsink package;

said laser diode package further comprising:

a glass seal comprising a glass seal coolant inlet through-hole and a glass seal coolant outlet through-hole, wherein a first side of said glass seal is fixedly connected to said microchannel layer of said first heat sink package, wherein an edge of said glass seal is retracted from the edge of said microchannel layer on said operating side about the length of a laser diode bar, wherein said glass seal coolant inlet and said glass seal coolant outlet are aligned with said microchannel coolant inlet and said microchannel coolant outlet respectively;

a second heatsink package substantially identical to said first heatsink package, wherein a second side of said glass seal is fixedly connected to the manifold layer of said second heatsink package, wherein said glass seal coolant inlet and said glass seal coolant outlet are operatively aligned with the coolant inlet and coolant outlet respectively of said second heatsink package; and a laser diode bar operatively and fixedly placed between said microchannel array of said first heatsink package and said manifold layer of said second heatsink package, wherein said laser diode bar is operatively and electrically connected to said conductive coating.

2. The laser diode package of claim 1, wherein said glass seal comprises a non-conductive portion upon which said laser diode bar is positioned.

3. The laser diode package of claim 2, wherein said laser diode bar is substantially centered between said first heatsink package and said second heatsink package and over said non-conductive portion.

4. The laser diode package of claim 2, wherein said laser diode bar is registered directly against said conductive layer of said microchannel layer, wherein said laser diode bar is located over said non-conductive portion.

5. The laser diode package of claim 4, further comprising a conductive spring operatively connected between said laser diode bar and said conductive coating of the manifold layer of said second heatsink package, wherein said conductive spring registers said laser diode bar directly against said microchannel layer of said first heatsink package.

6. The laser diode package of claim 5, further comprising a current spreader operatively fixed between said laser diode bar and said conductive spring, wherein said current spreader comprises an electrically conductive foil/bar that has the same nominal footprint as said laser diode bar, wherein said current spreader ensures uniform electrical pumping across said diode bar, and provides mechanical protection from said conductive spring.

7. The laser diode package of claim 2, wherein said microchannel layer of said first heatsink package and said manifold layer of said second heatsink package comprise a symmetric canted edges to provide a microlens support frame that allows passive lens alignment.

8. The laser diode package of claim 1, wherein said first heatsink package and said second heatsink package are anodically bonded together.

9. The laser diode package of claim 2, wherein said non-conductive portion comprises a notch into said glass seal.

10. A method for making a laser diode package, comprising:

fabricating a first heatsink package, comprising:

providing a manifold layer with a coolant inlet, a coolant outlet and a coolant outlet duct running from near an edge of said manifold to said coolant outlet;

providing a glass insert layer including a glass insert inlet trough-hole aligned with said coolant inlet, a glass insert edge opening aligned in proximity to said edge of said manifold layer and a glass insert outlet; through-hole aligned with said coolant outlet, fixedly connecting said glass insert layer to said manifold layer;

providing a microchannel layer fixedly connected to said glass insert layer, wherein said microchannel layer includes a microchannel coolant inlet aligned with said glass insert inlet through-hole, wherein said microchannel layer further comprises a microchannel layer outlet aligned with said glass insert outlet through-hole, wherein said microchannel layer includes a microchannel layer duct running from said microchannel coolant inlet to near an edge of said microchannel layer in proximity to said glass insert edge opening wherein said microchannel layer duct comprises a microchannel array; and providing a conductive coating adherent to an outer portion of said first heatsink package in proximity to (i) said edge of said microchannel layer, (ii) an edge of said glass insert layer in proximity to said glass insert edge opening and (iii) said edge of said manifold layer, wherein said edge of said glass insert layer defines the operating side of said heatsink package;

said method further comprising:

providing a glass seal comprising a glass seal coolant inlet through-hole and a glass seal coolant outlet through-hole, wherein a first side of said glass seal is fixedly connected to said microchannel layer of said first heat sink package, wherein an edge of said glass seal is retracted from the edge of said microchannel layer on said operating side about the the length of a laser diode bar, wherein said glass seal coolant inlet and said glass seal coolant outlet are aligned with said microchannel coolant inlet and said microchannel coolant outlet respectively;

fabricating a second heatsink package substantially identical to said first heatsink package, wherein a second side of said glass seal is fixedly connected to the manifold layer of said second heatsink package, wherein said glass seal coolant inlet and said glass seal coolant outlet are operatively aligned with the coolant inlet and coolant outlet respectively of said second heatsink package; and providing a laser diode bar operatively and fixedly placed between said microchannel array of said first heatsink package and said manifold layer of said second heatsink package, wherein said laser diode bar is operatively and electrically connected to said conductive coating.

11. The method of claim 10, wherein said glass seal comprises a conductive coating with a notch removed to form a non-conductive portion upon which a said laser diode bar is positioned.

12. The method of claim 11, wherein said laser diode bar is substantially centered between said first heatsink package and said second heatsink package and over said non-conductive portion.

13. The method of claim 11, wherein said laser diode bar is registered directly against said conductive layer of said microchannel layer, wherein said laser diode bar is located over said non-conductive portion.

14. The method of claim 13, further comprising providing a conductive spring operatively connected between said laser diode bar and said conductive coating of the manifold layer of said second heatsink package, wherein said conductive spring registers said laser diode bar directly against said microchannel layer of said first heatsink package.

15. The method of claim 14, further comprising providing a current spreader operatively fixed between said laser diode bar and said conductive spring, wherein said current spreader comprises an electrically conductive foil/bar that has the same nominal footprint as said laser diode bar, wherein said current spreader ensures uniform electrical pumping across said laser diode bar, and provides mechanical protection from said conductive spring.

16. The method of claim 11, wherein said microchannel layer of said first heatsink package and said manifold layer of said second heatsink package comprise a asymmetric canted edges to provide a microlens support frame that allows passive lens alignment.

17. The method of claim 10, wherein said first heatsink package and said second heatsink package are anodically bonded together.

18. The method of claim 11, wherein said non-conductive portion comprises a notch into said glass seal.

* * * * *